(12) United States Patent
Kumagai et al.

(10) Patent No.: US 7,580,265 B2
(45) Date of Patent: Aug. 25, 2009

(54) HEAT SINK, CIRCUIT BOARD, AND ELECTRONIC APPARATUS

(75) Inventors: Minoru Kumagai, Kawasaki (JP); Ikki Tatsukami, Kawasaki (JP); Takashi Iijima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/907,615

(22) Filed: Oct. 15, 2007

(65) Prior Publication Data

US 2008/0094802 A1    Apr. 24, 2008

Related U.S. Application Data

(63) Continuation of application No. PCT/JP2005/007346, filed on Apr. 15, 2005.

(51) Int. Cl.
H05K 7/20  (2006.01)
H01L 23/34  (2006.01)

(52) U.S. Cl. ............... 361/719; 257/719; 361/694; 361/695

(58) Field of Classification Search ............. 257/719; 361/719
See application file for complete search history.

(56) References Cited

U.S. PATENT DOCUMENTS

| | | |
|---|---|---|
| 4,513,812 A | 4/1985 | Papst et al. |
| 4,807,441 A | 2/1989 | Agee et al. |
| 5,022,462 A | 6/1991 | Flint et al. |
| 5,280,409 A | 1/1994 | Selna et al. |
| 5,299,632 A | 4/1994 | Lee |
| 5,335,722 A | 8/1994 | Wu |
| 5,377,745 A | 1/1995 | Hsieh |
| 5,409,352 A | 4/1995 | Lin |
| 5,430,611 A | 7/1995 | Patel et al. |
| 5,484,013 A | 1/1996 | Morikawa et al. |
| 5,486,980 A | 1/1996 | Jordan et al. |
| 5,504,650 A | 4/1996 | Katsui et al. |
| 5,522,700 A | 6/1996 | Hong |
| 5,583,316 A | 12/1996 | Kitahara et al. |
| 5,629,560 A | 5/1997 | Katsui et al. |
| 5,648,890 A | 7/1997 | Loo et al. |
| 5,648,893 A | 7/1997 | Loo et al. |
| 5,689,404 A | 11/1997 | Katsui |
| 5,756,931 A | 5/1998 | Kitahara et al. |
| 5,760,333 A | 6/1998 | Kitahara et al. |
| 6,140,571 A | 10/2000 | Kitahara et al. |
| 6,143,977 A | 11/2000 | Kitahara et al. |
| 6,166,904 A | 12/2000 | Kitahara et al. |

(Continued)

FOREIGN PATENT DOCUMENTS

DE    44 10 029    1/1995

(Continued)

Primary Examiner—Gregory D Thompson
(74) Attorney, Agent, or Firm—Staas & Halsey LLP (57) ABSTRACT

A heat sink that radiates n exoergic circuit elements mounted on a circuit board includes a housing that has a heat-receiving surface that receives heat from the n exoergic circuit elements, and n+2 fixture parts to each of which a fixture member is attachable, each fixture member compressively fixing the housing onto the circuit board, wherein n is equal to or greater than 2, the heat sink is used to commonly radiate the n exoergic circuit elements, and a line that connects two fixture members to each other among n+2 fixture members passes between two centers of gravity of two adjacent exoergic circuit elements.

8 Claims, 6 Drawing Sheets

U.S. PATENT DOCUMENTS

| | | | |
|---|---|---|---|
| 6,212,074 B1 * | 4/2001 | Gonsalves et al. | 361/717 |
| 6,396,701 B1 * | 5/2002 | Nakamura et al. | 361/706 |
| 6,567,269 B2 * | 5/2003 | Homer et al. | 361/700 |
| 6,654,247 B1 * | 11/2003 | Lee | 361/697 |
| 6,667,885 B2 * | 12/2003 | Malone et al. | 361/700 |
| 6,859,368 B2 * | 2/2005 | Yang | 361/704 |
| 7,057,897 B2 * | 6/2006 | Leu | 361/704 |
| 7,283,364 B2 * | 10/2007 | Refai-Ahmed et al. | 361/719 |
| 7,333,340 B2 * | 2/2008 | Zhang et al. | 361/719 |
| 2005/0117307 A1 * | 6/2005 | Tanaka | 361/719 |

FOREIGN PATENT DOCUMENTS

| | | |
|---|---|---|
| EP | 0 614 330 | 9/1994 |
| EP | 0 620 592 | 10/1994 |
| JP | 60-89946 | 5/1985 |
| JP | 62-260346 | 11/1987 |
| JP | 7-58470 | 3/1995 |
| JP | 7-79059 | 3/1995 |
| JP | 8-23182 | 1/1996 |
| JP | 8-255856 | 10/1996 |
| JP | 2001-144233 | 5/2001 |
| JP | 2001-257299 | 9/2001 |
| JP | 2002-111262 | 4/2002 |
| JP | 2003-258467 | 9/2003 |
| WO | 89/00751 | 1/1989 |

* cited by examiner

PRIOR ART

FIG. 7

HEAT SINK, CIRCUIT BOARD, AND ELECTRONIC APPARATUS

This application is a continuation based on International Patent Application No. PCT/JP2005/007346, filed on Apr. 15, 2005, which is hereby incorporated by reference herein in its entirety as if fully set forth herein.

BACKGROUND OF THE INVENTION

The present invention relates generally to a heat sink, a circuit board, and an electronic apparatus, and more particularly to a fixture of a heat sink onto the circuit board mounted with an exoergic circuit element (simply referred to as an exoergic element). The "electronic apparatus," as used herein, intends to cover, for example, a laptop personal computer ("PC"), a personal digital assistant ("PDA"), a server, an electronic dictionary, electronic stationery, and a game machine.

Along with the recent widespread electronic apparatuses, smaller and higher-performance electronic apparatuses have been increasingly demanded, and a reduction of the number of components is studied. A laptop PC is one typical electronic apparatus mounted with an exoergic element, such as a CPU and a chipset, and the heating value of the exoergic element increases as its performance improves. In order to thermally protect the exoergic element, a radiator referred to as a heat sink is thermally connected to the exoergic element. The heat sink includes one or more cooling fins, and radiates the exoergic element through natural cooling. The heat sink is placed on the exoergic element, and clamped at four corners around the exoergic element via fixture members. Each fixture member, such as a bolt that perforates a coil spring, presses the heat sink against the exoergic element, reduces the heat transmission loss, and maintains radiation efficiency.

Conventionally, a heat sink is mounted for each exoergic element, or no heat sink is mounted if the heating value of the exoergic element is lower than a preset one. One proposed method uses one radiator to simultaneously radiate plural exoergic elements, since the recent increasing mounting density arranges the CPU closer to the chipset. See, for example, Japanese Patent Application Nos. 08-255856, 07-058470, and 08-023182.

However, these references are silent about the way of fixing one heat sink onto plural exoergic elements. Even for one exoergic element, when the heat sink is compressively clamped onto the exoergic element at four corners, the compressive force does not become uniform. The heat transmission loss and thus the poor radiation effect are conspicuous as the compressive force decreases, causing a thermal breakdown. It is conceivable to increase the compressive force as a whole so that the minimum compressive force can exceed a preset value, but this configuration causes an overload and thus a mechanical breakdown at a highest pressure portion. As such, an elastic member, such as silicon rubber, may be inserted between the heat sink and the exoergic element so that the elastic member can rectify an uneven pressure distribution. However, the elastic member has such low heat conductivity that the radiation efficiency of the exoergic element deteriorates. As the recent exoergic element increases its heating value, the elastic member should be made thinner and it is difficult to maintain the thickness of the elastic member enough to rectify the uneven pressure distribution. Further, in radiating plural exoergic elements with one heat sink, one of them which is insufficiently cooled is subject to thermal breakdown.

BRIEF SUMMARY OF THE INVENTION

Accordingly, it is an illustrative object of the present invention to provide a heat sink, a circuit board, and an electronic apparatus which can efficiently and effectively radiate one or more exoergic circuit elements.

A heat sink according to one aspect of the present invention that radiates n exoergic circuit elements mounted on a circuit board includes a housing that has a heat-receiving surface that receives heat from the n exoergic circuit elements, and n+2 fixture parts to each of which a fixture member is attachable, each fixture member compressively fixing said housing onto the circuit board. This heat sink reduces the number of fixture members from conventional 4n, reducing the cost, improving the mounting density, and miniaturizing the electronic apparatus. In addition, the heat sink can fix each exoergic circuit element at three points. Three points geometrically define one plane, and provide more stable fixation than the four-point fixture. A compression between the heat sink and the exoergic circuit element reduces the heat transmission loss between them, and improves the radiation efficiency. The "circuit board," as used herein, may be not only a printed board (also referred to as a "motherboard" and "system board"), but also a package substrate mounted on the printed board, such as a ball grid array ("BGA") package and a land grid array ("LGA") package.

When n=1, the center of gravity of the exoergic circuit element is preferably arranged at or near the center of gravity of the triangle having three vertexes at centers of these three fixture members. When the exoergic circuit element is located in the triangle, the fixing force by each fixture member reaches the exoergic circuit element, and when their centers of gravity are close to each other, the fixing force distribution applicable to the exoergic circuit element is likely to become uniform. When n is equal to or greater than 2, it is preferable that the heat sink is used to commonly radiate the n exoergic circuit elements, and a line that connects two fixture members to each other among n+2 fixture members passes between two centers of gravity of two adjacent exoergic circuit elements. Thus, each exoergic circuit element can be arranged in the triangle.

A distance may be 1 cm or smaller between one exoergic circuit element among the n exoergic circuit elements and one of three fixture members among the n+2 fixture members, which three fixture members are closest to the one exoergic circuit element, the one of the three fixture members being the most distant from the one exoergic circuit element among the three fixture members. When this distance is excessively long, the pressure distribution over each of the n exoergic circuit elements is likely to be uneven. The heat sink may further include a cooling fin that is connected to the housing and radiates at least one of the n exoergic circuit elements. Thereby, whether the cooling fin is provided can be selected in accordance with the heating value. The cooling fin may be configured to be detachable from the housing. Thereby, plural types of cooling fins having different sizes are manufactured and one of the types is combined with the housing so as to fit one of the exoergic circuit elements having different sizes and heating values. The heat sink may further include a cooling fan that sends air to and compulsorily cools the cooling fin (fan-cum heat sink). Thereby, one cooling fan can simultaneously cools the n exoergic circuit elements.

A circuit board according to another embodiment includes n exoergic circuit elements, the above heat sink, and n+2 fixture members that compressively fix the heat sink against the n exoergic circuit elements. This circuit board can exhibit the operations similar to those of the above heat sink. Each of the n+2 fixture members may apply a variable compressive force. Thereby, an uneven compressive force can be prevented when the top surface of the exoergic circuit element is not horizontal.

An electronic apparatus comprising the above circuit board, such as a laptop PC, also constitutes one aspect of the present invention.

Other objects and further features of the present invention will become readily apparent from the following description of preferred embodiments with reference to the accompanying drawings.

DETAILED DESCRIPTION OF THE PREFERRED EMBODIMENTS

Figure 1:
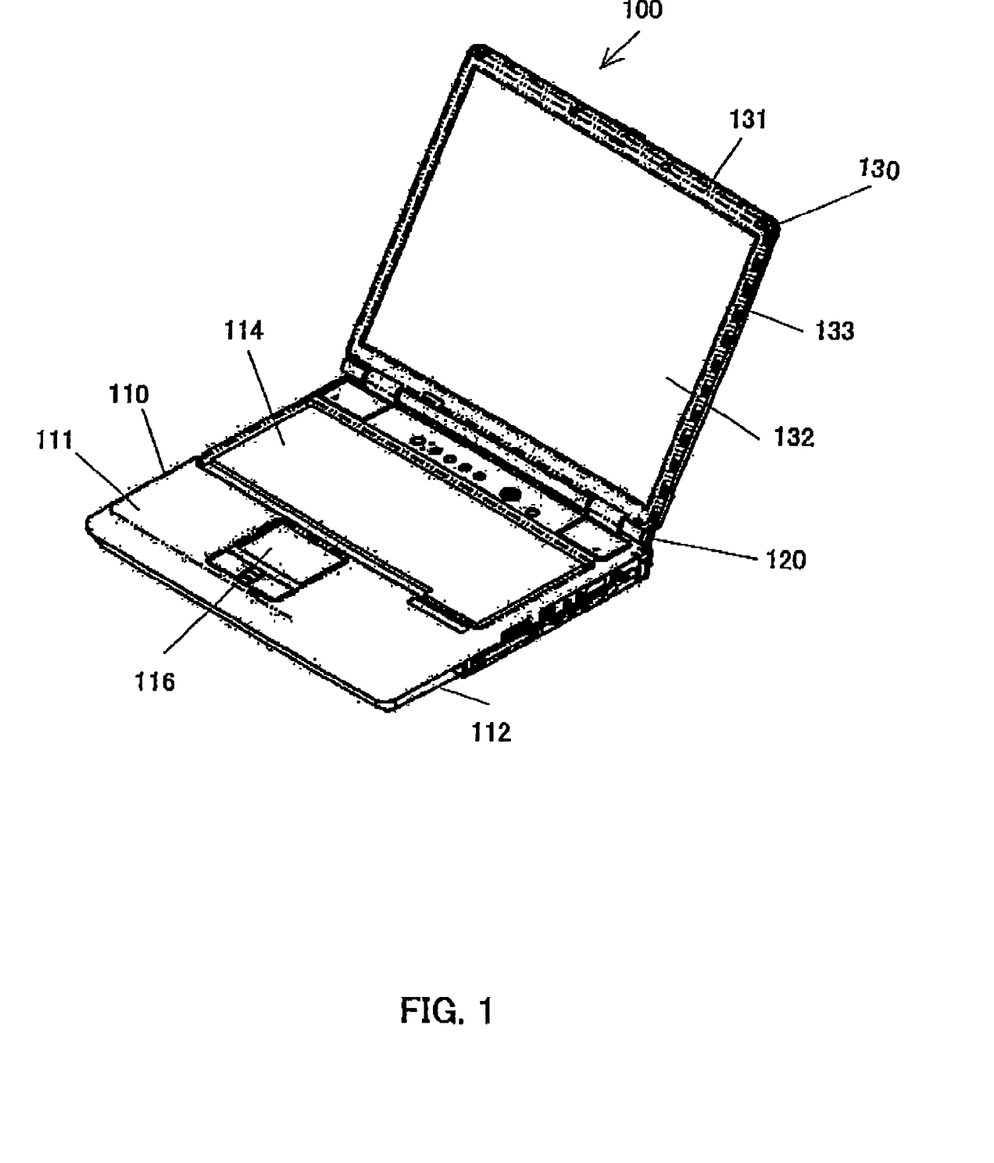
FIG. 1 is a perspective overview of an electronic apparatus (laptop PC) according to one aspect of the present invention.

Referring now to the accompanying drawings, a description will be given of an electronic apparatus 100 according to one embodiment of the present invention, which is implemented as a laptop PC. Here, FIG. 1 is a perspective overview of the laptop PC 100 in the unfolded state. Referring to FIG. 1, the electronic apparatus 100 is illustratively implemented as, but not limited to, the laptop PC 100. The electronic apparatus 100 may be another portable electronic apparatus, such as a PDA, hand-held PC, a palm-sized PC, a wearable PC, an electronic dictionary, electronic stationery, a gaming machine, and a portable household appliance (e.g., a portable TV, a portable VCR, and a portable DVD). The size of the laptop PC 100 intends to cover an A4 size, a B5 size, another sub-notebook size, and a mini-notebook size.

The laptop PC includes a PC body 110, a hinge 120, a display unit (LCD bezel frame) 130, and a motherboard (circuit board) 140 (not shown in FIG. 1). The body 110 and the display unit 130 constitute a housing of the laptop PC 100.

The body 110 has a housing structure, for example, with a thickness between about 20 mm and about 30 mm. The body 110 includes an upper cover 111, a middle cover (not shown), and a lower cover 112. Each of the upper cover 111, a middle cover, and a lower cover 112 is made of resin molding. The body 110 accommodates a motherboard 140 and a hard disc drive ("HDD"), and the upper cover 111 has a keyboard 114 for information typing, and a pointing device 116.

The upper cover 111 is a palm rest on which palms or wrists are placed, and is located in front of the keyboard 114. A type of the keyboard 114 is not limited, such as 101, 106, 109, ergonomic, and the keyboard arrangement is not also limited, such as QWERT, DVORAK, JIS, new-JIS, and NICOLA (Nihongo Nyuryoku COnthotium LAyout). The pointing device 116 emulates part of a mouse function, and has a touch-pad, a pair of click buttons, and a roll-type scroll wheel. The touch pad realizes the mouse function on the LCD screen 132 when the user moves his index finger on the touch pad. The pair of click buttons serves as mouse's left and right click buttons. Since the roll-type scroll wheel is located between the left and right click buttons and serves as a mouse's scroll wheel, the operability of the pointing device 116 improves.

The hinge part 120 has a hinge cover and a shaft. The hinge part 120 connects the display unit 130 with the body 110 so that the display unit 130 can rotate around the body 110. The hinge cover is mounted with a power button, but this arrangement is merely illustrative.

The display unit 130 includes a front cover 131, an LCD screen 132, and a back cover 133. The front cover 131 and the back cover 133 are screwed with each other, and the LCD screen 132 is arranged between them. The front cover 131 is a hollow rectangular frame made of resin molding, and is connected to a hinge cover on the center bottom. The back cover 133 has a substantially rectangular shape when viewed from its front, and has a sectionally U-shape in which both sides rise. The back cover 133 is connected to the hinge cover at its center bottom, and made of resin molding.

Figure 2:
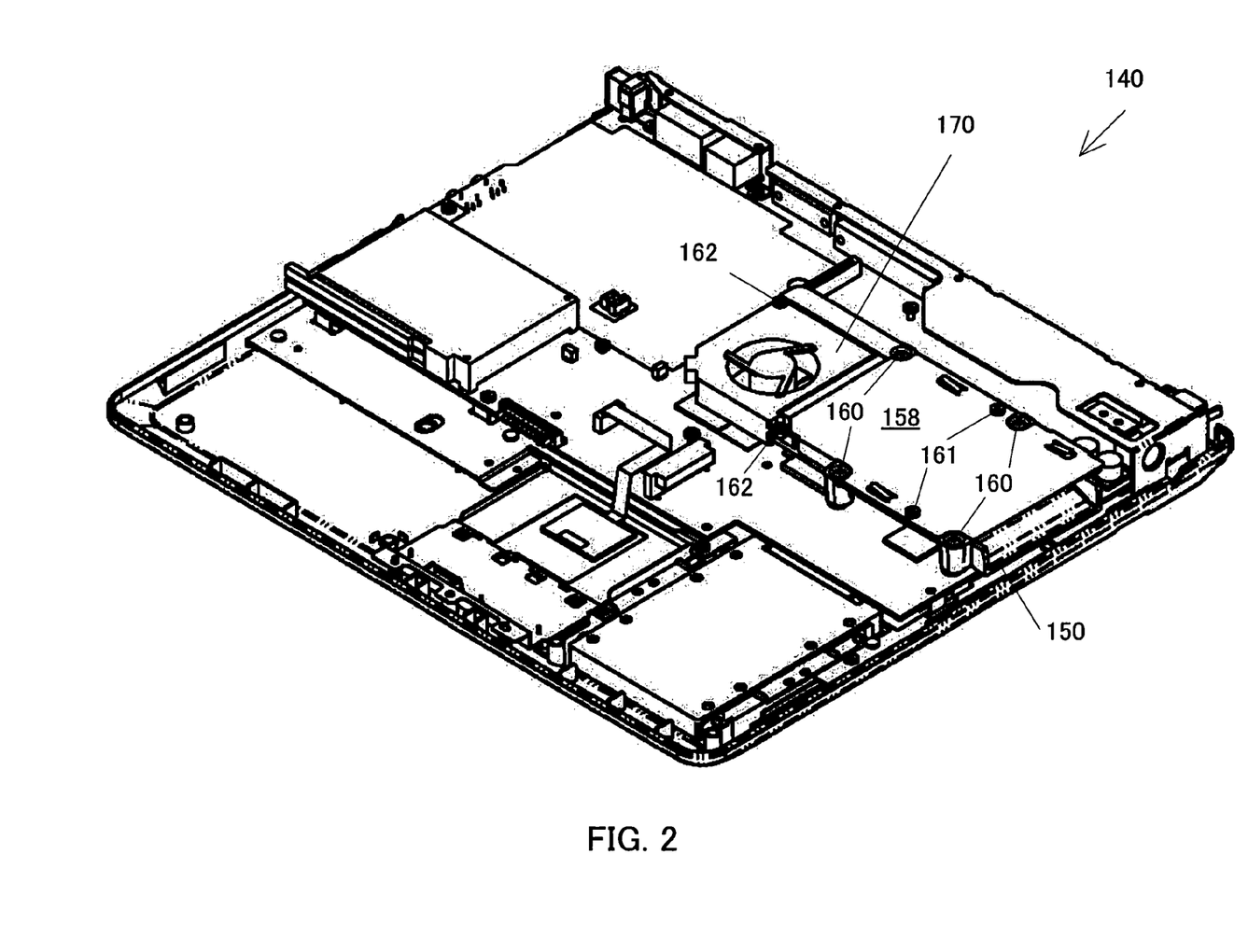
FIG. 2 is a perspective overview of a motherboard (circuit board) in the electronic apparatus shown in FIG. 1.
Figure 3:
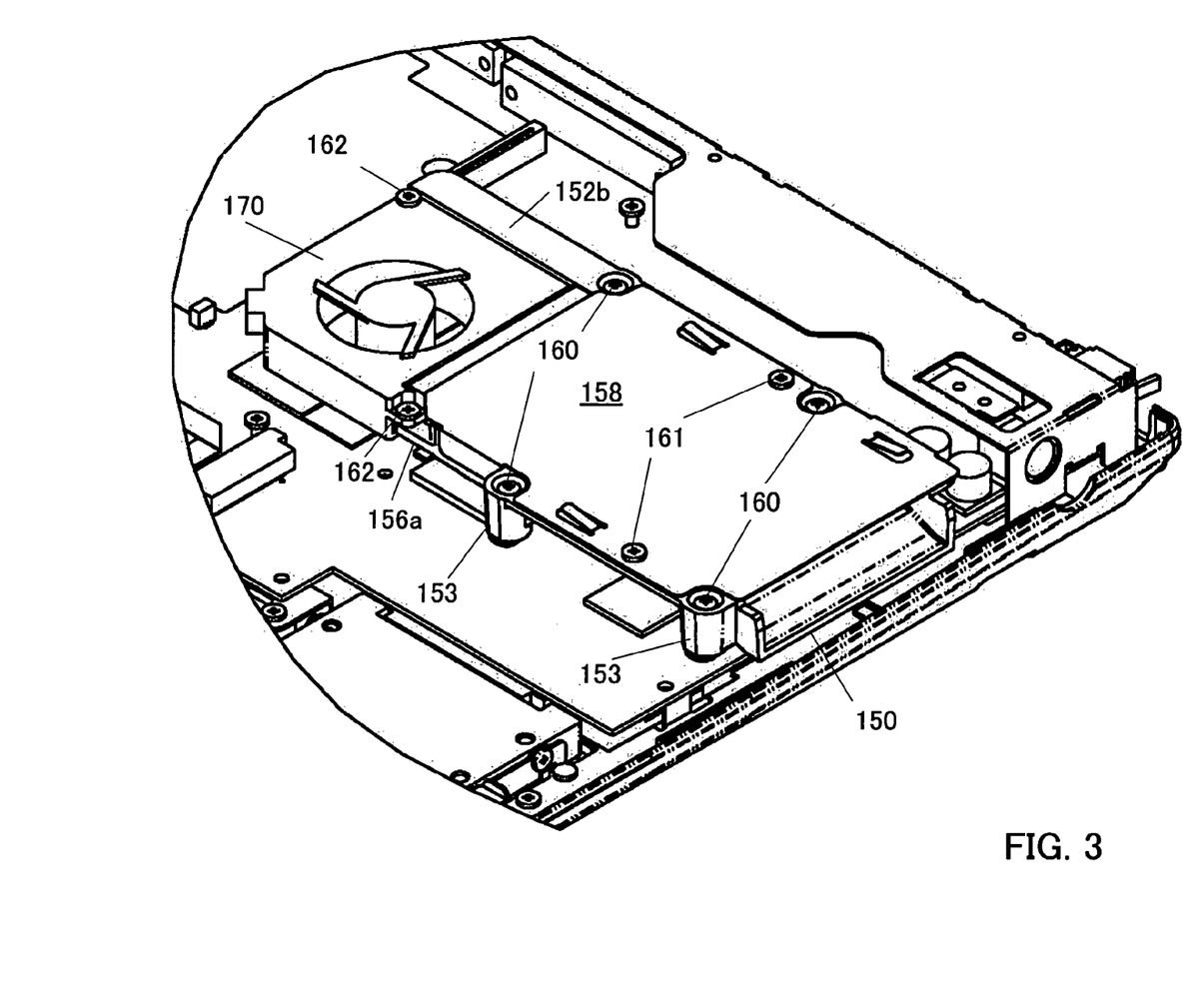
FIG. 3 is a partially exploded perspective view of the motherboard shown in FIG. 2.
Figure 4:
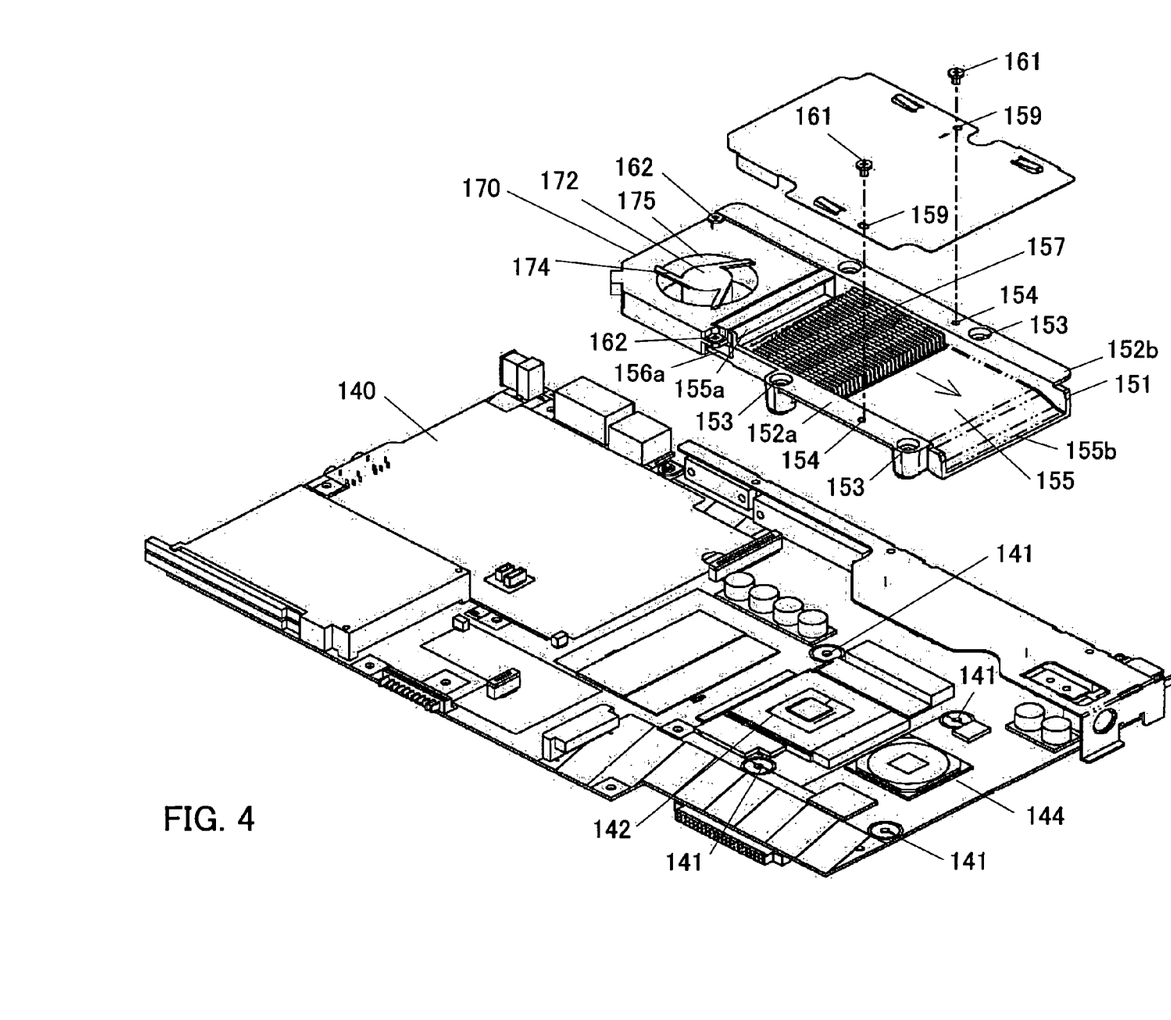
FIG. 4 is an exploded perspective view of the motherboard shown in FIG. 2 near the heat sink.
Figure 5:
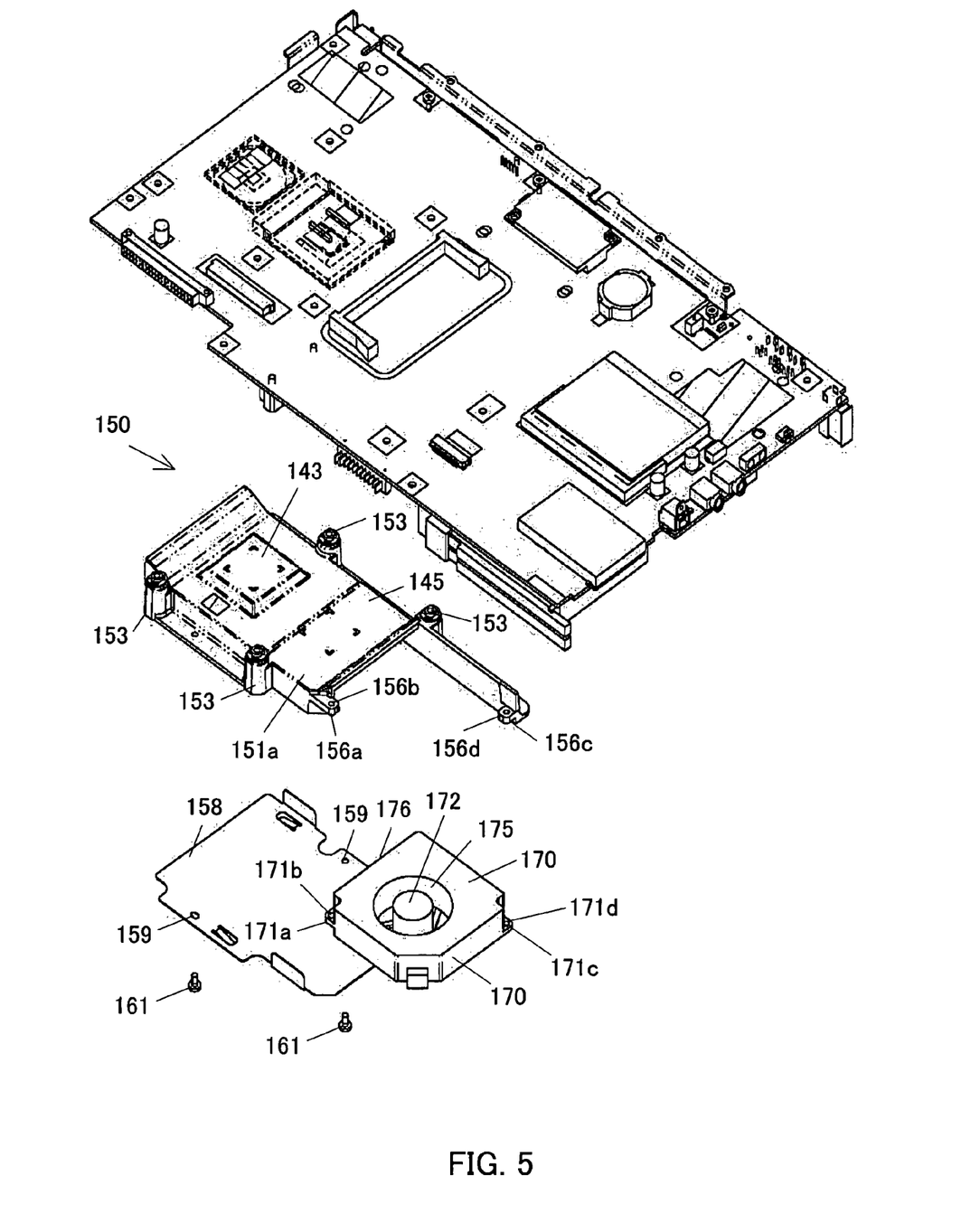
FIG. 5 is an exploded perspective view of a back of the motherboard shown in FIG. 2 near the heat sink.

The motherboard 140 includes, as shown in FIGS. 2-5, a CPU 142, a chipset 144, a heat sink 150, and a cooling fan 170, and is mounted with various other circuit elements for use with the laptop PC 100. Here, FIG. 2 is a perspective overview of the motherboard 140. FIG. 3 is a partially enlarged perspective view of the motherboard 140. FIG. 4 is an exploded perspective view near the heat sink 150 of the motherboard 140. FIG. 5 is an exploded perspective view of a back of the motherboard 140 near the heat sink 150. The motherboard 140 has four fixture holes 141 as shown in FIG. 4.

The CPU 142 and chipset 144 are typical exoergic elements, and their types are not limited. Along with the recent high mounting density, a distance between them becomes smaller. The heating value of the CPU 142 is greater than that of the chipset 144, but the heating value of the chipset 144 is yearly increasing due to its built-in high-performance graphic processing unit. While this embodiment illustratively addresses the CPU and the chipset as exoergic elements, the present invention is applicable to cooling another exoergic element, such as a package IC and component.

As shown in FIG. 5, the CPU 142 and the chipset 144 are attached to the heat sink 150 via silicon rubbers 143 and 145. The silicon rubber 143 fills a space between the CPU 142 and the heat sink 150 and the silicon rubber 145 fills a space between the chipset 144 and the heat sink 150. The silicon rubbers 143 and 145 are used to make uniform the pressure distributions applied to the CPU 142 and the chipset 144, but have low thermal conductivities, lowering the radiation efficiency for the CPU 142 and the chipset 144. Therefore, the increasing heating value of each of the CPU 142 and the chipset 144 requires each silicon rubber to be so thin that the silicon rubber has a difficulty in rectifying the uneven pressure distribution. As described later, this embodiment fixes the heat sink 150 onto the motherboard 140 so that the pressure distributions applied to each of the CPU 142 and the chipset 144 can be uniform, and thus the silicon rubbers 143 and 145 are omitted in another embodiment.

In this embodiment, the CPU 142 and the chipset 144 share the heat sink 150 for radiations. The heat sink 150 is a fan-cum heat sink that includes a housing 151, plural cooling fins 157, a cover 158, and a cooling fan 170.

The housing 151 is a frame that has a U-shape section as shown in FIG. 4, and is made, for instance, of aluminum, copper, aluminum nitride, artificial diamond, plastic, or other materials of high thermal conductivity, and connected to the heat spreader 140. The housing is manufactured by sheet metal working, aluminum die casting, or other processes. The housing 151, if made of plastic, may be formed, for example, by injection molding. A back surface of the housing 151 is lower than the fixture part 153, as shown in FIG. 5, and this height difference accept the CPU 142 and chipset 144 via the silicon rubbers 143 and 145. The back surface of the housing 151 serves as a heat-receiving surface 151a that receives the heat from the CPU 142 and the chipset 144.

The housing 151 has a pair of brackets 152a and 152b, four fixture parts 153, and plural screw holes 154, a ventilation passage 155, and a pair of attachment parts 156a and 156c.

The brackets 152a and 152b are connection parts used to attach the housing 151 to the motherboard 140 as well as attaching the cover 158 and cooling fan 170 to the housing 151. The brackets 152a and 152b are formed at both upper sides, as shown in FIG. 4, and extend along the longitudinal direction of the housing 151. The bracket 152b is longer than the bracket 152a along the longitudinal direction of the housing 151, forming an L-shaped space used to attach the cooling fan 170. The bracket 152a has a pair of fixture parts 153, one screw hole 154, and the attachment part 156a. The bracket 152b has a pair of fixture parts 153, one screw hole 154, and the attachment part 156c.

Each of the four fixture parts 153 serves to attach the housing 151 to the motherboard 140, and houses a coil spring (not shown). A screw 160 is inserted into each fixture part 153, and fastened in the fixture hole 141. The screw 160 applies a compressive force to the housing 151 via the coil spring, so that the heat sink 150 is pressed against the CPU 142 and the chipset 144 with the compressive force. When all the screws 160 are detached from the fixture parts 153, the heat sink 150 can be easily separated from the CPU 142 and the chipset 144. Since this embodiment does not adhere the heat sink 150 to the exoergic element through the heat-hardening adhesive (such as soldering), the CPU 142 and the chipset 144 can be easily exchanged in case of operational failures.

Figure 6:
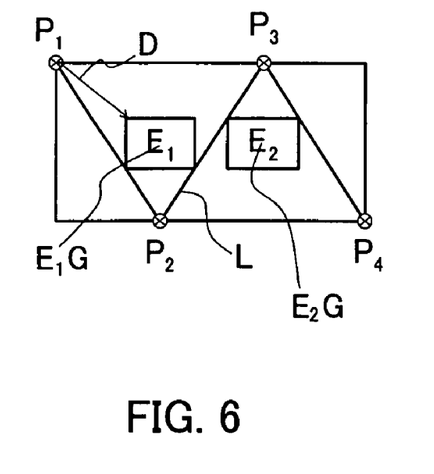
FIG. 6 is an exploded plane view for explaining a heat-sink fixing method according to one embodiment.
Figure 7:
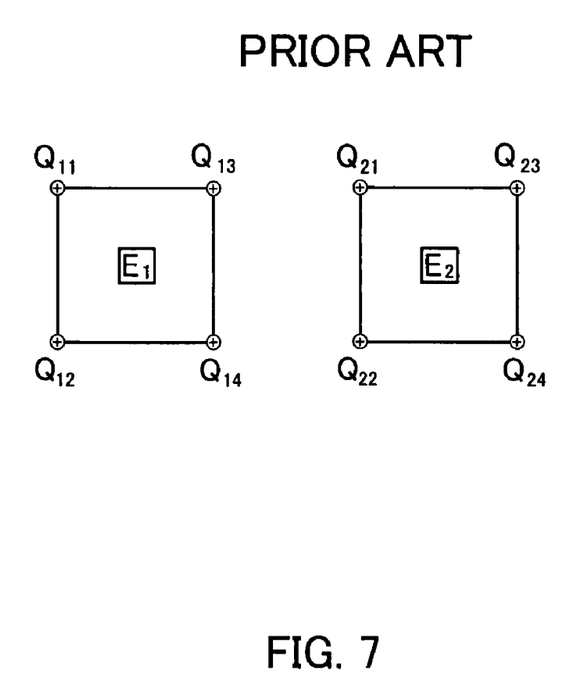
FIG. 7 is a schematic plane view for explaining a conventional heat-sink fixing method.

An arrangement of the fixture parts 153 effectively makes the pressure distribution uniform applied by the screws 160. Referring now to FIGS. 6 and 7, a description will be given of the compressive clamping by the fixture parts 153 and the screws 160. Here, FIG. 6 is a schematic plane view for explaining a principle of the compressive clamping of this embodiment. FIG. 7 is a schematic plane view for explaining the conventional compressive clamping. This embodiment uses four compressive clamping points (or fixture parts) $P_1$ to $P_4$ so as to commonly compressively fix two exoergic elements $E_1$ and $E_2$ as shown in FIG. 6. On the other hand, prior art uses, as shown in FIG. 7, four compressive clamping points $Q_{11}$ to $Q_{14}$ to compressively fix the exoergic element $E_1$ and four compressive clamping points $Q_{21}$ to $Q_{24}$ to compressively fix the exoergic element $E_2$. The four compressive clamping points $Q_{11}$ to $Q_{14}$ are arranged at four corners of the exoergic element $E_1$, and the four compressive clamping points $Q_{21}$ to $Q_{24}$ are arranged at four corners of the exoergic element $E_2$. The compressive clamping force applied by the compressive clamping points $Q_{11}$ to $Q_{14}$ is independent of that applied by the compressive clamping points $Q_{21}$ to $Q_{24}$.

The configuration shown in FIG. 7 is likely to cause an uneven pressure distribution applied to each of the exoergic elements $E_1$ and $E_2$, resulting in an insufficient radiation. According to the instant inventors' studies of this cause, three points geometrically define one plane whereas the conventional four-point arrangement can define plural planes, making the compressive clamping unstable. This embodiment provides the heat sink with (n+2) fixture parts used to compressively fix the heat sink against n exoergic elements. The heat sink reduces the number of screws 160 from 4n in the prior art configuration down to (n+2), and provides reduced costs, improved mounting density, and a smaller electronic apparatus. In addition, this heat sink can compressively fix each of the exoergic elements $E_1$ and $E_2$ at three points. Three points define one plane, and provide more stable fixture than the four points.

When the number n of the exoergic elements is 1, (a center of gravity of) the exoergic element is preferably arranged at a center of gravity of a triangle that has three vertexes at the n+2=3 fixture parts. When an exoergic element exists in the triangle, a clamping force from each fixing member equally acts on the exoergic element. In this respect, three points closest to the exoergic element dominate the compressive clamping of the exoergic element, but the arrangement of FIG. 7 is not preferable because four fixture parts $Q_{11}$ to $Q_{14}$ are located equally distant from the exoergic element $E_1$. In addition, when the center of gravity of the exoergic element is arranged at or near the center of gravity of the triangle, the clamping force distribution applied to the exoergic element is likely to be uniform. It is therefore preferable for the exoergic element $E_1$ shown in FIG. 7 not only to remove $Q_{14}$ from the fixture members $Q_{11}$ to $Q_{14}$ but also to arrange the exoergic element $E_1$ at or near the center of gravity of the triangle formed by the fixture members $Q_{11}$ to $Q_{13}$. Any triangle may be employed, but it is preferable as described later that three vertexes of the apexes of the triangle are close to the exoergic element. In addition, an isosceles triangle or equilateral triangle is preferable for a uniform pressure distribution applied from each vertex to the exoergic element. Further, the "arrangement of the exoergic element at or near the center of gravity" preferably allows for a perfect correspondence between the center of the gravity of the triangle and the center of gravity of the exoergic element, but intends to permit a slight difference between them.

Instead of assign three fixture parts to each exoergic element shown in FIG. 7 so as to independently compressively fix the exoergic element (for example, instead of assigning three fixture parts $Q_{11}$, $Q_{12}$, and $Q_{14}$ for the exoergic element $E_1$, and three fixture parts $Q_{11}$, $Q_{22}$, and $Q_{24}$ to the exoergic element $E_1$), FIG. 6 commonly uses fixture parts $P_2$ and $P_3$ for the two exoergic elements $E_1$ and $E_2$. As a result, the number of fixture parts is reduced from 3n to (n+2), achieving a further reduction of the number of components.

For the number n of the exoergic elements equal to or greater than 2, the heat sink commonly radiates the n exoergic elements, and there is preferably a line that connects two fixture parts or members to each other and passes between two centers of gravity of a pair of adjacent exoergic elements among the (n+2) exoergic elements. In FIG. 6, a line L connects the fixture parts $P_2$ and $P_3$ and passes between a pair of centers of gravity $E_1G$ and $E_2G$ of two adjacent exoergic elements $E_1$ and $E_2$. Thereby, the center of gravity of each exoergic element can be located in the triangle. FIG. 6 arranges (the center of gravity $E_1G$ of) the exoergic element $E_1$ in the triangle formed by $P_1$, $P_2$, and $P_3$, and (the center of gravity $E_2G$ of) the exoergic element $E_2$ in the triangle formed by $P_2$, $P_3$, and $P_4$, realizing the above effect of a triangle.

Further, in three fixture members among the (n+2) fixture members, which three fixture members are closest to one exoergic element, a distance is maintained preferably 1 cm or smaller between the one exoergic element and the fixture member that is the most distant from the one exoergic element. Three fixture parts $P_1$ to $P_3$ are closest to the exoergic element $E_1$ in FIG. 6, a distance D is preferably 1 cm or smaller between the exoergic element $E_1$ and the fixture part or member, such as $P_1$ and $P_3$ which is the most distant from the exoergic element $E_1$. An excessively long distance is likely to make uneven the pressure distribution to the n exoergic elements. In other words, the three fixture members closest to the exoergic element are preferably located close to one another.

Turning back to FIGS. 2 to 5, the pressure applied by each screw is adjustable or made variable by adjusting a fastening force of the screw 160. Thereby, even when the height of the CPU 142 is different from the height of the chipset 144, the pressure distribution applied to the CPU 142 and the chipset 144 can be adjusted and made uniform.

Each of a pair of screw holes 154 is a hole into which each screw 161 is inserted. The ventilation passage 155 serves as a cooling gas (i.e., air) channel from a suction port 155a to an exhaust port 155b. The exhaust port 155b extends downwardly, and is wider than the suction port 155a. The air emitted from the exhaust port 155b is configured to blow a radiation metal plate (not shown) or flow from the exhaust port at the side of the body 110 to the outside. Since the fan-cum heat sink is connected to the radiation plate, the temperature of the fan-cum heat sink can be always maintained approximately constant (for example, at the room temperature).

The attachment part 156a is provided at the tip of the bracket 152a, and has a screw hole 156b. The attachment part 156c is provided at the tip of the bracket 152a, and has a screw hole 156d. A screw 162 is inserted into each of the screw holes 156b and 156d.

The cooling (or radiating) fin 157 is comprised of a high heat-transmission member (fin assembly) with many aligned plate-shaped fins, and naturally cools the CPU 142 and the chipset 144. The cooling fins 157 are provided at the back surface of the heat-receiving plane, arranged opposite to the CPU 142, and housed in the housing 151. The cooling fin 157 has a convex shape, increases a surface area, and enhances a radiation effect. However, the shape of the cooling fin 157 is not limited to one like a plate, and any arbitrary arrangement shapes like a pin, a curve, etc. may be adopted. The cooling fins 157 do not necessarily have to be aligned horizontally at a regular interval, but may be placed radially or obliquely with respect to the housing 151. Moreover, the number of the cooling fins 157 may be set arbitrarily. The cooling fins 157 are preferably made of a material of high thermal conductivity, such as aluminum, copper, aluminum nitride, artificial diamond, and plastic. The cooling fins are formed by molding, a press fit, brazing, welding, injection molding, or the like.

This embodiment does not provide the cooling fins 157 over the chipset 144, reducing the cost and weight by providing the cooling fins 157 only at a position necessary for the radiation. The cooling fins 157 may be divided from the housing 151. Thereby, the cooling fin 157 with a necessary size may be attached onto the housing 151 in accordance with the heating value of the exoergic element.

The cover 158 defines a top of the ventilation passage 155, and has a pair of attachment holes 159. A screw 161 is inserted into the attachment hole 159, and the screw 161 is inserted into the screw hole 154. As a result, the cover 158 is fixed onto the housing.

The cooling fan 170 rotates to generate airflow, and compulsorily cools the cooling fins 157. The cooling fan 170 includes attachment parts 171a and 171c, a power section 172, and a propeller section 174 fixed onto the power section 172.

The attachment part 171a is attached to the attachment part 156a, to which the bracket 152a is provided, and the attachment part 171c is attached to the attachment part 156c, to which the bracket 152b is attached. The attachment part 171a has an attachment hole 171b, and is connected to the screw hole 156b. The attachment part 171c has an attachment hole 171d, and is connected to the screw hole 156d. As a result, the cooling fan 170 is fixed onto the housing 150.

The power section 172 typically includes a rotary shaft, a bearing around the rotary shaft, a bearing house, and a magnet for a motor. However, the power section 172 may use any structure known in the art, and a detailed description thereof will be omitted. In order to prevent the heat transmission to the bearing house, an adiabatic member is preferably formed on the inner wall surface of the bearing house. The adiabatic member includes a thin film made, for example, of a low heat transmission material, such as fluoride resin and silicon resin.

The propeller section 174 includes a number of angled, isogonally or non-isogonally arranged rotors, which have a predetermined size. The power section 172 and the propeller section 174 may or may not be separable in the cooling fan 170. Wiring connected to the cooling fan 170 is omitted in the figure.

The cooling fan 170 has a pair of suction ports 175, and an exhaust port 176. The suction port 175 is provide in the top and bottom surfaces parallel to the motherboard 140, and absorbs the air from both sides. The exhaust port 176 is formed in a surface perpendicular to the motherboard 170. Thus, the suction direction is orthogonal to the exhaust direction in the cooling fan 170. The cooling fan 170 is arranged on approximately the same plane as the cooling fin 175, and contributes to a low profile of the laptop PC 100.

In operation, a user of the laptop PC 100 operates the keyboard 14 and the pointing device 116. The heat generated from the CPU 142 transfers to the cooling fins 157 via the heat-receiving part 151a of the housing 151 thermally connected to the CPU 142. As a result, the heat is naturally cooled from the cooling fins 157 and the housing 151. The heat from the chipset 142 is radiated from the surface of the housing 151. In addition, the blast from the cooling fin 170 compulsorily cools the cooling fins 157. The blast passes the ventilation passage 155, and compulsorily cools the surface of the housing 151 over the chipset 142, enhancing the radiation efficiency. The cooling fan 170 may be electrified and operated always or only when a temperature sensor detects the heating value from the CPU 142 is greater than the preset value.

This embodiment reduces the number of fixture parts 153 from conventional 4n to (n+2), and contributes to a further mounting density of the motherboard 140. In addition, since the pressure applied by the heat sink 150 uniformly distributes over the CPU 142 and the chipset 144, the predetermined radiation efficiency can be maintained. Moreover, the chipset 144 is not radiated in the prior art. On the other hand, this embodiment radiates the chipset 144 to some extent although the radiation for the chipset 144 is less than that for the CPU 142 (or although the cooling fins 157 are not provided), and easily prevents a thermal breakdown and a malfunction of the chipset 144. Thus, the heat sink of the present invention does not necessarily require the cooling fin, and can provide various radiations at different levels.

Further, the present invention is not limited to these preferred embodiments, and various variations and modifications may be made without departing from the scope of the present invention. For example, while the number n of exoergic elements is 2 in this embodiment, but a compressively fixture method of the heat sink of this embodiment is applicable even when n is 3 or greater.

Thus, the present invention can provide a heat sink, a circuit board, and an electronic apparatus which can efficiently and effectively radiate one or more exoergic circuit elements.

What is claimed is:

1. A heat sink that radiates n exoergic circuit elements mounted on a circuit board, where n is equal to or greater than 2, said heat sink comprising:
   a housing that has a heat-receiving surface that receives heat from the n exoergic circuit elements; and
   n+2 fixture parts to each of which a fixture member is attachable, each fixture member compressively fixing said housing onto the circuit board, wherein the heat sink is used to commonly radiate the n exoergic circuit elements, and
   wherein the n+2 fixture parts include four fixture parts configured to fix adjacent first and second ones of the exoergic circuit elements, the four fixture parts including a pair of first, diagonally arranged, fixture parts and a pair of second, diagonally arranged, fixture parts, the first exoergic circuit element being located inside of a first triangular area having vertices at the pair of first fixture parts and a first one of the second fixture parts and outside of a second triangular area having vertices at the pair of first fixture parts and a second one of the second fixture parts, and the second exoergic circuit elements being located outside of the first triangular area and inside of the second triangular area.

2. A heat sink according to claim 1, wherein the n+2 fixture parts are arranged so as to maintain a distance of approximately 1 cm or smaller between one of the exoergic circuit elements and a most distant fixture part among the neighboring fixture parts of the one of the exoergic circuit elements.

3. A heat sink according to claim 1, further comprising a cooling fin that is connected to the housing and radiates heat from at least one of the n exoergic circuit elements.

4. A heat sink according to claim 3, wherein the cooling fin is configured to be detachable from the housing.

5. A heat sink according to claim 3, further comprising a cooling fan that sends air to and compulsorily cools the cooling fin.

6. A circuit board comprising:
   n exoergic circuit elements where n is equal to or greater than 2;
   a heat sink that is used to commonly radiate the n exoergic circuit elements, the heat sink including a housing that has a heat-receiving surface that receives heat from the n exoergic circuit elements, and n+2 fixture parts; and
   n+2 fixture members each of which is attached to a corresponding one of the n+2 fixture parts, and configured to compressively fix the heat sink against the n exoergic circuit elements,
   wherein the n+2 fixture parts include four fixture parts configured to fix first and second adjacent ones of the exoergic circuit elements, the four fixture parts including a pair of first, diagonally arranged, fixture parts and a pair of second, diagonally arranged, fixture parts, the first exoergic circuit element being located inside of a first triangular area having vertices at the pair of first fixture parts and a first one of the second fixture parts and outside of a second triangular area having vertices at the pair of first fixture parts and a second one of the second fixture parts, and the second exoergic circuit elements being located outside of the first triangular area and inside of the second triangular area.

7. A circuit board according to claim 6, wherein each of the n+2 fixture members applies a variable compressive force.

8. An electronic apparatus comprising a circuit board, wherein the circuit board includes:
   n exoergic circuit elements where n is equal to or greater than 2;
   a heat sink that is used to commonly radiate the n exoergic circuit elements, the heat sink including a housing that has a heat-receiving surface that receives heat from the n exoergic circuit elements, and n+2 fixture parts; and
   n+2 fixture members each of which is attached to a corresponding one of the n+2 fixture parts, and configured to compressively fix the heat sink against the n exoergic circuit elements,
   wherein the n+2 fixture parts include four fixture parts configured to fix adjacent first and second ones of the exoergic circuit elements, the four fixture carts including a pair of first, diagonally arranged, fixture parts and a pair of second, diagonally arranged, fixture parts, the first exoergic circuit element being located inside of a first triangular area having vertices at the pair of first fixture parts and a first one of the second fixture parts and outside of a second triangular area having vertices at the pair of first fixture parts and a second one of the second fixture parts, and the second exoergic circuit elements being located outside of the first triangular area and inside of the second triangular area.

* * * * *

UNITED STATES PATENT AND TRADEMARK OFFICE
CERTIFICATE OF CORRECTION

| | |
|---|---|
| PATENT NO. | : 7,580,265 B2 |
| APPLICATION NO. | : 11/907615 |
| DATED | : August 25, 2009 |
| INVENTOR(S) | : Minoru Kumagai et al. |

It is certified that error appears in the above-identified patent and that said Letters Patent is hereby corrected as shown below:

Column 10, Line 36, change "carts" to --parts--.

Signed and Sealed this

First Day of December, 2009

David J. Kappos
*Director of the United States Patent and Trademark Office*